United States Patent [19]
Ohannes et al.

[11] Patent Number: 5,223,745
[45] Date of Patent: Jun. 29, 1993

[54] POWER DOWN MILLER KILLER CIRCUIT

[75] Inventors: James R. Ohannes, Portland; Stephen W. Clukey, South Portland; Ernest D. Haacke, Westbrook; Roy L. Yarbrough, Hiram, all of Me.

[73] Assignee: National Semiconductor Corporation, Santa Clara, Calif.

[21] Appl. No.: 930,471

[22] Filed: Aug. 14, 1992

Related U.S. Application Data

[63] Continuation-in-part of Ser. No. 803,201, Dec. 6, 1991, abandoned.

[51] Int. Cl.$^5$ .................. H03K 19/02; H03K 19/088
[52] U.S. Cl. ........................... 307/446; 307/456; 307/443
[58] Field of Search ............ 307/446, 456, 443, 300, 307/473, 475, 296.4, 296.6

[56] References Cited

U.S. PATENT DOCUMENTS

| | | | |
|---|---|---|---|
| 4,311,927 | 1/1982 | Ferris | 307/473 |
| 4,321,490 | 3/1982 | Bechdolt | 307/456 |
| 4,330,723 | 5/1982 | Griffith | 307/300 |
| 4,572,970 | 2/1986 | Allen et al. | 307/300 |
| 4,698,525 | 10/1987 | Tavana et al. | 307/300 |
| 5,051,623 | 9/1991 | Yarbrough et al. | 307/473 |
| 5,107,141 | 4/1992 | Yano et al. | 307/446 |
| 5,132,569 | 7/1992 | Matsuda | 307/446 |
| 5,153,456 | 10/1992 | Keown | 307/456 |

Primary Examiner—Edward P. Westin
Assistant Examiner—Richard Roseen
Attorney, Agent, or Firm—Thomas L. Bohan; Richard C. Calderwood

[57] ABSTRACT

A circuit to be used with bistate and tristate output buffers as a means of diverting from the output pulldown transistor Miller Current arising while the output buffer is powered down. Its purpose is to avoid loading the common bus to which the output buffer is attached, in particular under the circumstances where other output buffers on the bus are causing transitions to occur and the buffer of interest has been powered down. In its preferred embodiment the invention utilizes a MOS transistor coupled between the output pulldown transistor and the lower potential power rail of the output buffer. This MOS transistor is controlled by another MOS transistor coupled to output $V_{OUT}$ of the buffers. This driver transistor is controlled by the high potential power rail of the buffer and so turns on the Miller Current Discharge Transistor only when the buffer is powered down. The invention also encompasses a discharge transistor coupled to the data input $V_{IN}$ to ensure that the Miller Current Discharge Transistor never pulls the of the output pulldown when the buffer is in its active low state.

20 Claims, 6 Drawing Sheets

POWER DOWN MILLER KILLER CIRCUIT

This is a continuation-in-part of application Ser. No. 803,201, filed Dec. 6, 1991, now abandoned.

CROSS-REFERENCE TO RELATED PATENT APPLICATIONS

This invention is related to the James R. Ohannes, Stephen W. Clukey, E. David Haacke, Roy L. Yarbrough, Susan M. Keown, and Michael G. Ward U.S. Pat. application Ser. No. 804,105 filed concurrently for BiCMOS OUTPUT BUFFER CIRCUIT WITH CMOS DATA PATHS & BIPOLAR CURRENT APPLICATION, and to other U.S. Patent Amplification there referenced. In its preferred embodiment the present invention is an improvement on the basic BiCMOS output buffer circuit described in the above-referenced U.S. Patent Application.

BACKGROUND OF THE INVENTION

1. Field of the Invention

The technical field of this invention lies with output buffer circuits utilized to couple a multiplicity of logic circuits to a common bus. More particularly, this invention is related to means for ensuring high speed switching of said bus and in particular to preventing that power-draining switch-delaying transient state where a buffer's pulldown (current sinking) circuitry is activated at the wrong time. More particularly yet, it is related to that category of subcircuits known generically as "Miller Killers," the purpose of which is to ensure that the output pulldown transistor of said buffer is subject to neither spurious turn-on nor delay in turning off caused by Miller Current-generated base current. The term "Miller Current" is generally associated with the parasitic current affecting the performance of bipolar output pulldown transistors. When a MOS transistor is the output pulldown transistor, the delay mechanism is different; nevertheless, both are caused by the propagation of a parasitic current and the overall effect remains the same, namely, a delay in the turn-off of that pulldown transistor. For the purpose of the following discussion, this parasitic current will be identified as a Miller Current. It is to be understood, however, that the present invention is directed to preventing delays in pulldown transistor turn-off, regardless of whether that pulldown transistor is a bipolar or a MOS device. Most particularly, the present invention relates to a subcircuit designed to kill the Miller Current during the period that powerdown of said buffers and associated circuitry disables traditional Miller Killer devices while leaving it possible for Miller Current to cause spurious current sinking at pulldown transistors. The powerdown situation where the present invention finds its greatest potential application is that where a specific buffer is powered down, yet still coupled to a common bus being acted on by other buffers which are not powered down. Under those circumstances Miller Current generated at the output of the powered-down buffer will not be discharged by the MK circuits previously disclosed.

The Power Down Miller Killer circuit which is the subject of this invention has applicability to bistate and tristate BiCMOS output buffers. In its preferred embodiment, it is comprised of NMOS and PMOS transistors and shields the bipolar or MOS output pulldown transistors of a bistate or tristate BiCMOS output buffer from Miller Current. More particularly, the preferred embodiment relates to the BiCMOS output buffer circuit described in the related patent application identified above. Such output buffer circuits incorporate the low power requirements, high input impedance, and high speed advantages of NMOS and PMOS transistors along with the high current amplification and low output impedance advantages of bipolar transistors.

2. Description of Prior Art

The switching conditions hitherto identified as requiring Miller Killer remediation are: 1) an active-low to active-high output buffer transition; 2) an inactive-mode (high Z) output buffer having its output forced high (e.g., due to the L→H switching action of another output buffer coupled to the bus); 3) an output buffer being switched from active-high to its inactive mode. In each case the goal has been to prevent Miller Current from going to ground through the base-emitter junction of the pulldown transistor, the effect which causes or prolongs unwanted conduction of the pulldown transistor. Apart from the deleterious effects of having the pulldown transistor conducting when it should be blocking, significant switching delays can be introduced. The problem can be overcome by providing a low-resistance path to ground from the control node of the pulldown transistor. The general approach has been to couple the control node of the output pulldown transistor to ground (low potential power rail) across a transistor (the MK transistor) coupled to circuitry which turns it on during the period that Miller Current would otherwise cause an unwanted base current in the output pulldown transistor. Because of the variety of circumstances under which MK circuits are required, a particular buffer circuit may have a multiplicity of MK transistors, each being turned on upon a particular switching sequence.

The earliest-issued MK patent is that of Bechdolt, U.S. Pat. No. 4,321,490 (1982): "Transistor Logic Output for Reduced Power Consumption and Increased Speed During Low to High Transition." Bechdolt discloses an AC Miller Killer (ACMK) circuit addressing the switching delay and power drain associated with a low to high (L→H) output transition of an active output buffer. In its L output state just prior to the L→H transition, the buffer is sinking current through its pulldown transistors. The transition requires the turnon of the pullup transistors so that they source current to $V_{OUT}$ from a high potential power rail $V_{CCN}$ and for the concurrent turnoff of the pulldown transistors so that they block. Included in the turnoff transient of the pulldown transistors is the time required to charge the Miller Capacitance by the pullup transistors, which leads to an effective postponement of blocking by the pulldown transistor. The parasitic current into the pulldown transistor retards the turnoff of that transistor and provides a window during which both pullup and pulldown transistors are conducting, coupling $V_{CCN}$ to GNDN. This causes a significant power drain and prolongs the time required for the current-sourcing circuit to complete the L→H switch at the bus. The MK transistor of Bechdolt is a bipolar transistor coupled between the control node of the pulldown transistor and GNDN. Its base is coupled to $V_{out}$ through a capacitor which is sufficiently large that, upon the L→H output transition which provides the Miller Current, it passes through enough capacitive current to turn on the MK transistor. This guarantees that the L→H output transition which causes Miller Current also turns on the ACMK transistor which pulls the control node of the pulldown transistor to GNDN and ensures that the turnoff of that transistor is not delayed.

The MK circuit of Ferris, U.S. Pat. No. 4,311,927 (1982), "Transistor Logic Device with Reduced Output Capacitance," is directed at Miller Current generated at the output pulldown transistors of inactive output buffers during L→H switching of the bus. It alleviates the problem arising from the fact that a tristate output buffer in the so-called "high Z" state still—by virtue of its large Miller Capacitance—presents to the bus a fairly low ac impedance. Thus when the output of an inactive buffer is forced high (by an L→H transition of an active buffer connected to the common bus) a significant Miller Current will flow. The results are as before—a potential power drain through the turned-on output pulldown transistor (which can potentially occur for each of the inactive output buffers connected to the bus) and a delay in the completion of the L→H transition of the bus. The MK transistor of Ferris is also coupled between the control node of the output pulldown transistor and GNDN. Its base is coupled to the enable gate in such a way that when the OE input is Low-placing the buffer in its inactive, high Z mode—the MK transistor is on, providing a low impedance path to ground from the output pulldown transistor's node. (To achieve this, two additional transistors—beyond the MK transistor itself—must be included as intermediaries between the OE input and the base node of the MK transistor.) Since the MK transistor of Ferris is maintained conducting throughout the time the buffer is in its high Z state, it is designated a dc Miller Killer (DCMK). Subsequent developments of the DCMK are described in Vazehgoo, U.S. Pat. No. 4,649,297 (1987), "TTL Circuits for Generating Complementary Signals" and in Yarbrough et al., U.S. Pat. No. 5,051,623 (1991), "TTL Tristate Circuit for Output Pulldown Transistor."

The pending U.S. Patent application of Ward, Ser. No. 881,540, filed May 12, 1992, addresses the third case: the transient when the output buffer is making a transition from the L active state to the inactive high Z state. Like the ACMK, the MK action of Ward is triggered by the switch; to distinguish it from the ACMK operative in just the active state, it is designated as Z/ACMK.

Unfortunately, none of the prior art Miller Killer circuits provides Miller Current protection when the output buffer circuit is powered down, that is, when—for whatever reason—the dc voltage $V_{CC}$ falls below a certain critical threshold. This is a serious lapse, since the current sinking action of the pulldown transistor can still be activated, even for $V_{CC}$ below this level. This can then give rise to bus loading when a particular output buffer or the entire multiplicity of buffers is powered down. More practically, it presents a potential loading of the common bus when individual buffers have been powered down while the extended circuit continues to operate, with L→H transitions continuing on the bus. What is needed is a Miller Killer circuit which is triggered by low $V_{CC}$ levels and continues to provide protection for as long as the buffer is powered down.

DESCRIPTION OF RELATED INVENTION

The BiCMOS tristate output buffer circuit according to the related patent application identified above is illustrated in FIG. 1. FIG. 1A shows an alternative version of the related-art circuit illustrated in FIG. 1, with a MOS output pulldown transistor substituted for the bipolar output pulldown transistor shown in FIG. 1. This non-inverting BiCMOS output buffer circuit is powered by split high potential power rails $V_{CCQ}$ and $V_{CCN}$ and by split low potential power rails GNDQ and GNDN and delivers signals of high and low potential levels H, L at the output $V_{OUT}$ in response to high and low potential data signals at the input $V_{IN}$. For example, a logic high potential input at $V_{IN}$, after passing through a double inversion predriver circuit comprised of MOS transistors, triggers a Darlington bipolar output pullup transistor pair Q24, Q22 so as to source current from the high potential output supply rail $V_{CCN}$ through resistor R6 and diode D1 coupled to the collector node of bipolar output pullup transistor Q22 to the output $V_{OUT}$. Similarly, a logic low input at $V_{IN}$, after passing through the double inversion predriver circuit turns on high-current-capacity output pulldown transistor pair Q44A,Q44B, that then sink current from the output $V_{OUT}$ to the low potential output ground rail GNDN.

More precisely and with continuing reference to FIG. 1, the input $V_{IN}$ is coupled directly to a CMOS pullup-driver-circuit composed of a first pullup-predriver-input-inverter-stage Q15,Q14 and, through intermediate node n1, to a pullup driver inverter stage Q21A,Q20. This second inverter stage Q21,Q20 is coupled to the base nodes of bipolar output pullup transistors Q24,Q22. A logic high data signal H at the input $V_{IN}$ thus causes the second pullup driver inverter stage PMOS transistor Q21A to provide base drive current to bipolar transistor Q24. Bipolar transistor Q24, coupled via its collector node to the high potential power rail $V_{CCN}$ through Schottky diode SD1 and resistor R5, in turn sources amplified base drive current to bipolar output pullup transistor Q22.

In contrast, a logic low data signal L at the input $V_{IN}$ causes the second pullup-driver-inverter-stage NMOS transistor Q20 to couple the base of bipolar output pullup transistor Q24 directly to GNDQ and the base of bipolar output pullup transistor Q22 to GNDQ through the forward-biased Schottky diode pair SD11,SD12 in series—thus turning off both pullup transistors. Schottky diodes SD11,SD12 are added to the base discharge path of Q22 as a means of shielding Q22 against emitter/base reverse breakdown which might otherwise occur when $V_{out}$ is forced high with the output buffer disabled (in its high Z mode). The presence of diodes SD11 and SD12 increases by an amount equal to the forward voltage drops of these two diodes the value that any voltage appearing at $V_{out}$ must have in order to cause current flow through the emitter/base junction of Q22. In the absence of this breakdown protection a high potential level signal at $V_{out}$ from another output buffer circuit on a common bus might otherwise cause current to flow in a discharge path through Q22 and Q20, loading down the bus.

As FIG. 1 shows, $V_{in}$ is also coupled to a CMOS pulldown-predriver-input-inverter stage Q11,Q10 and, through intermediary node n2, to pulldown driver inverter stage Q60,Q9A. This second pulldown stage Q60,Q9A is coupled to the base node of the bipolar output pulldown transistor Q44, actually a pair of high-current-capacity transistors Q44B,Q44A. NMOS pulldown driver transistor Q60 has a control gate node coupled to a common node n2 of the pulldown predriver input stage Q11,Q10. The pulldown-driver transistor Q60 is coupled to the high potential power rail $V_{CCQ}$ through diode SD3 so that when Q60 is conducting, it sources drive current to the base of bipolar output pulldown transistor Q44. Transistor Q60 is an effective "phase splitter," operating bipolar output pulldown transistor Q44 out of phase with bipolar output pullup transistor Q22.

The pulldown driver stage also includes a "Miller Killer" (MK) transistor Q9A coupled for sinking parasitic Miller capacitance current from the base node of bipolar pulldown transistor Q44 to the output ground GNDN. An MK predriver stage Q40,Q41 is coupled between the common node n2 of the pulldown predriver input stage Q11,Q10 and the control gate node of the MK transistor Q9A. The small-current-conducting MK transistor Q9A and the two MK predriver stage transistors Q40,Q41 are all constructed with small channel widths so as to enhance the speed of switching. The operation of MK transistor Q9A is sufficiently fast that it operates as an AC Miller Killer (ACMK) when the buffer makes a L→H output transition as well as a DC Miller Killer (DCMK) transistor during steady-state high Z, i.e., when the output $V_{out}$ of an inactive buffer is forced high. Thus, it works as an ACMK for L→H output transitions when the buffer is in its active state and as a DCMK during the period the buffer is in its inactive (high Z) state.

An accelerating feedback diode SD4 is coupled between the output $V_{out}$ and the drain node pulldown driver transistor Q60. Discharge current from the output $V_{out}$ is therefore fed back through the primary current path of this NMOS pulldown-driver transistor Q60 in order to accelerate turn-on of the bipolar output pulldown transistor pair Q44 during a H→L output transition.

The related-art BiCMOS output buffer circuit of FIG. 1 also incorporates a tristate enable circuit having complementary tristate enable signal inputs E and EB. A CMOS pullup enable stage Q16,Q13 is coupled in a NAND gate coupling with the pullup- predriver-input stage Q15,Q14, where the NAND gate inputs are the data input $V_{in}$ and the enable signal input E, respectively. Thus, the PMOS transistors Q16,Q15 are coupled in parallel and the NMOS transistors Q14,Q13 are coupled in series.

A pulldown tristate enable stage Q12,Q9 is coupled in a NOR gate coupling with the input pulldown predriver stage Q11,Q10 in the second data signal path. Thus, PMOS transistors Q12,Q11 are coupled in series and NMOS transistors Q10,Q9 are coupled in parallel. The NOR gate inputs are the data input $V_{in}$ and the complementary enable signal input EB. Multiple output buffers of this type may be incorporated, for example, as output buffers in an octal buffer line driver.

SUMMARY OF THE INVENTION

The present invention is a Miller Killer circuit which discharges Miller Current when its associated output buffer is powered down. It remains available to sink Miller Current for as long as the buffer is powered down. An illustration of the problem to be resolved is provided by FIG. 2, which depicts the current sinking which occurs at an inactive buffer—primarily through its pulldown transistor—when its $V_{OUT}$ is forced high. The test circuit giving rise to this current is the related-art BiCMOS tristate output buffer depicted in FIG. 1. Note the magnitude of current and also the duration of the transient. FIG. 3 depicts the improved transient characteristics in the same BiCMOS circuit when a particular embodiment of the present invention has been added to the circuit. The magnitude of current and the duration of the transient have both been significantly improved.

As with the prior art MK circuits, the present invention is built around a transistor coupling the control node of the output pulldown transistor to ground (or, more generally, to the low potential power rail). The goal is always to in effect ground the pulldown transistor at the appropriate time. The other MK circuits depend upon the buffer in which they operate being powered up, that is, upon there being a minimum potential difference between the high potential power rail and the low potential power rail. The present invention in contrast utilizes a MK transistor—deployed as described—which is controlled by a MK driver transistor in such a way that it is conducting only when $V_{CCQ}$ is O v or very low. Because of this reason, the present invention is referred to as a Power Down Miller Killer (PDMK). The control node of the PDMK driver transistor—control gate node it it is a MOS and base node if it is a bipolar transistor—is coupled directly to the high potential power rail of the buffer in which it resides. The bulk of the PDMK driver transistor Q99A of FIG. 5, et al., is tied to $V_{OUT}$ and the primary current path of this transistor is between $V_{OUT}$ and the control node of the PDMK transistor itself. For definitiveness, take the PDMK driver transistor to be an PMOS transistor. As long as the buffer is powered up, $V_{CCQ}$ will have its normal positive voltage on the order of 5 volts. Nothing that comes in on the bus will make the transistor gate negative with respect to the bulk, which means that the PDMK driver transistor will remain non-conducting. If it remains non-conducting, it cannot provide a turn-on voltage to the PDMK transistor. For definitiveness, take the PDMK transistor to be an NMOS transistor. It requires a logic high signal at its control gate to turn on. For the reasons set out above, as long as the buffer is powered up (and $V_{CCN}$ has normal values), no such signal will appear there. In contrast, if $V_{CCN}$ is 0 V—i.e., the buffer is powered down—then when $V_{OUT}$ is forced high, the PDMK driver transistor's gate will be negative with respect to its bulk and will therefore become conducting, coupling the forced-high $V_{OUT}$ to the gate of the PDMK transistor. This ensures that the NMOS PDMK transistor conducts and hence "shorts" the base of the output pulldown transistor to ground; i.e., it couples the pulldown transistor base to GNDN, for the bipolar pulldown transistor shown in FIG. 5 et al.

As a safeguard, to ensure that the illustrated PDMK transistor does not inadvertently pull the base of the pulldown transistor to GNDN while the buffer is powered up and active, a third transistor is added to the PDMK circuit of the present invention. This is the PDMK disabler, a transistor which pulls off the control node of the PDMK transistor itself to GNDN—ensuring that the PDMK transistor remains non-conducting—when the buffer is in an active low state. In one embodiment of the invention, this disabler transistor is an NMOS coupled between the control node of the PDMK transistor and GNDN and having its control gate controlled jointly by the buffer's input $V_{IN}$ and the enabling circuitry. More particularly, in this embodiment of the invention, the control gate of the disabler transistor is taken from the output of a CMOS pulldown-predriver-inverter stage the common control gates of which are coupled directly to the buffer's $V_{IN}$. This CMOS pulldown-predriver-inverter stage is coupled on one side directly to the low potential power rail and on the other to the high potential rail through a PMOS transistor the control gate of which is coupled to one of the buffer enable inputs, EB. When the buffer circuit is enabled (in the active mode), a logic low data signal applied to $V_{IN}$ results in a logic high signal at the control gate of the disabler transistor. This makes the disabler transistor conducting and hence makes the PDMK transistor non-conducting, which was to be desired. For the other buffer states (active high and inactive) the disabler transistor has no effect on the PDMK transistor.

BRIEF DESCRIPTION OF THE DRAWINGS

FIG. 5 depicts an alternate on the preferred embodiment of the present invention incorporated into the related-art circuit as illustrated in FIG. 5 but with a MOS output pulldown transistor in place of the bipolar output pulldown transistor shown therein.

PREFERRED EMBODIMENT OF THE INVENTION

Figure 1A:
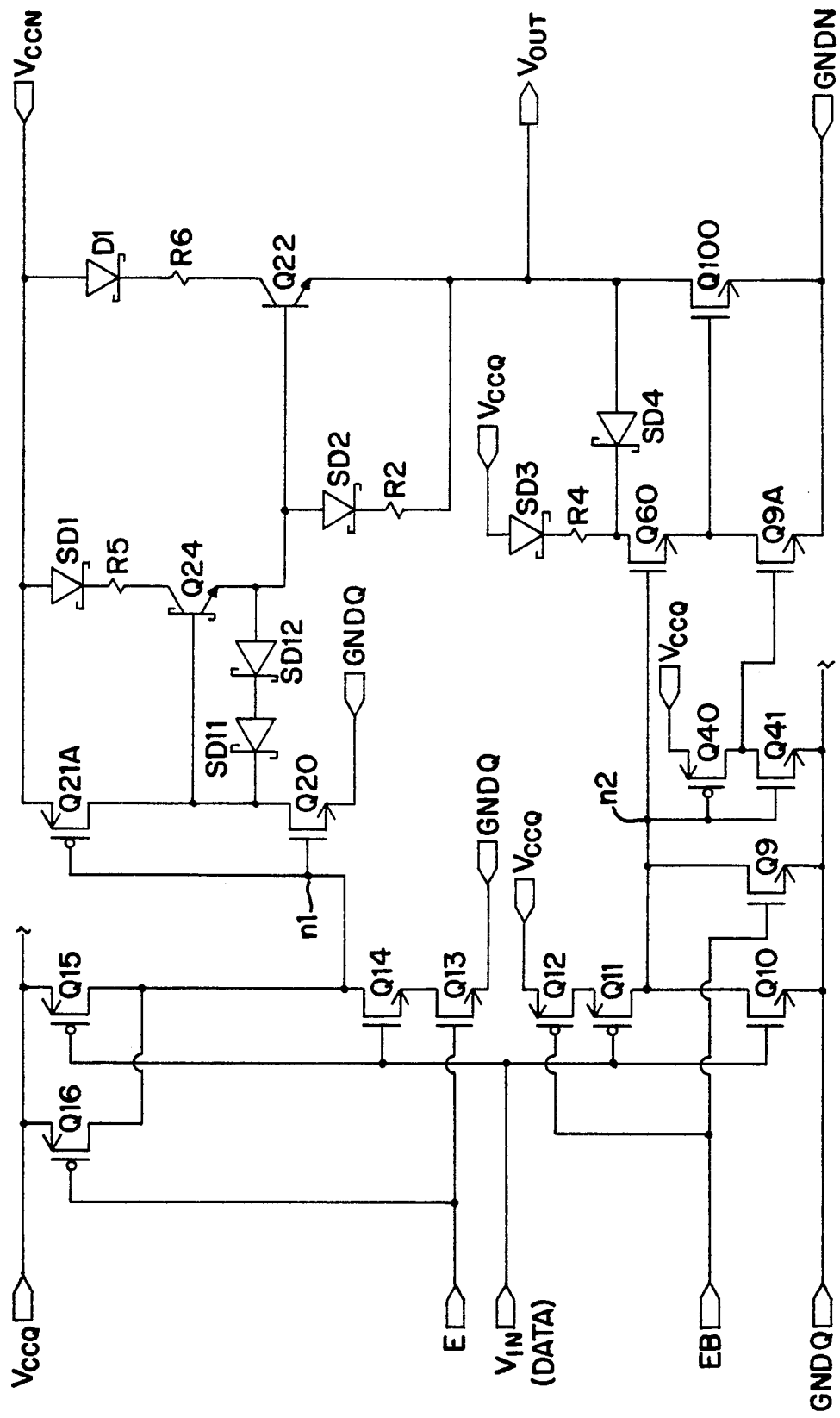
FIG. 1A is a schematic diagram of the BiCMOS tristate output buffer circuit illustrated in FIG. 1 but with a MOS output pulldown transistor in place of the bipolar output pulldown transistor shown therein.
Figure 1:
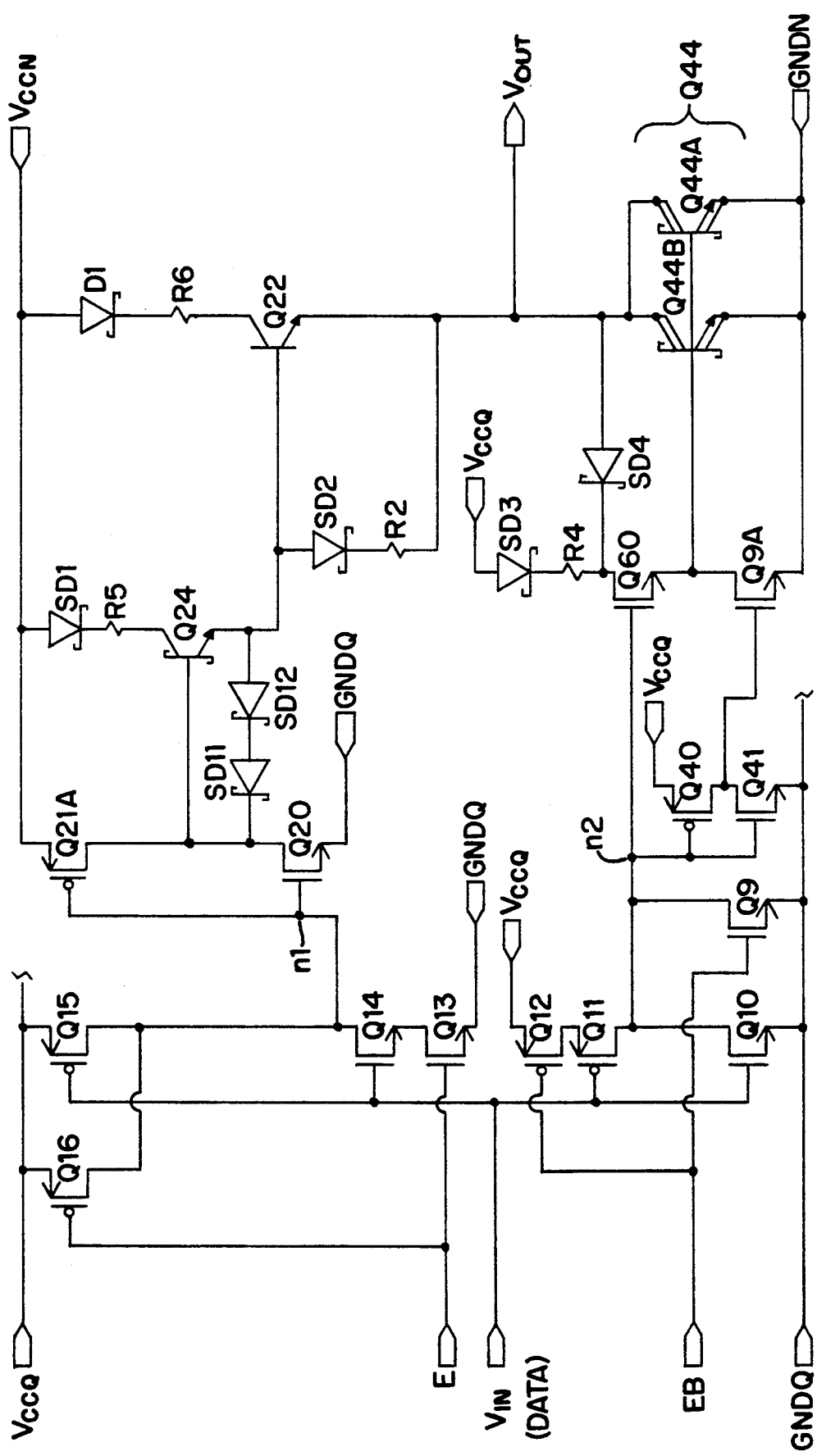
FIG. 1 is a schematic diagram of the BiCMOS tristate output buffer circuit which is the subject of the related James R. Ohannes et al. U.S. patent application Ser. No. 804,105 filed concurrently for BiCMOS OUTPUT BUFFER CIRCUIT WITH CMOS DATA PATHS AND BIPOLAR CURRENT AMPLIFICATION.
Figure 2:
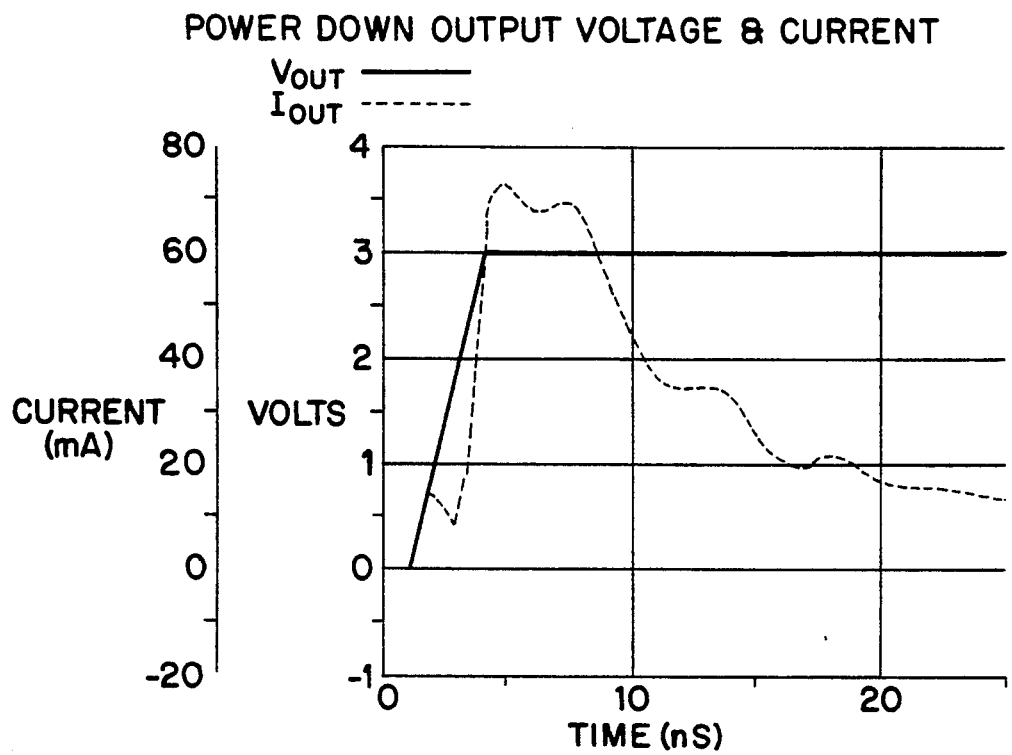
FIG. 2 is a graph showing the measured dynamic current sinking at the output of the related-art circuit depicted in FIG. 1 when the circuit is powered down and its output is forced high by the common bus to which it is connected.
Figure 3:
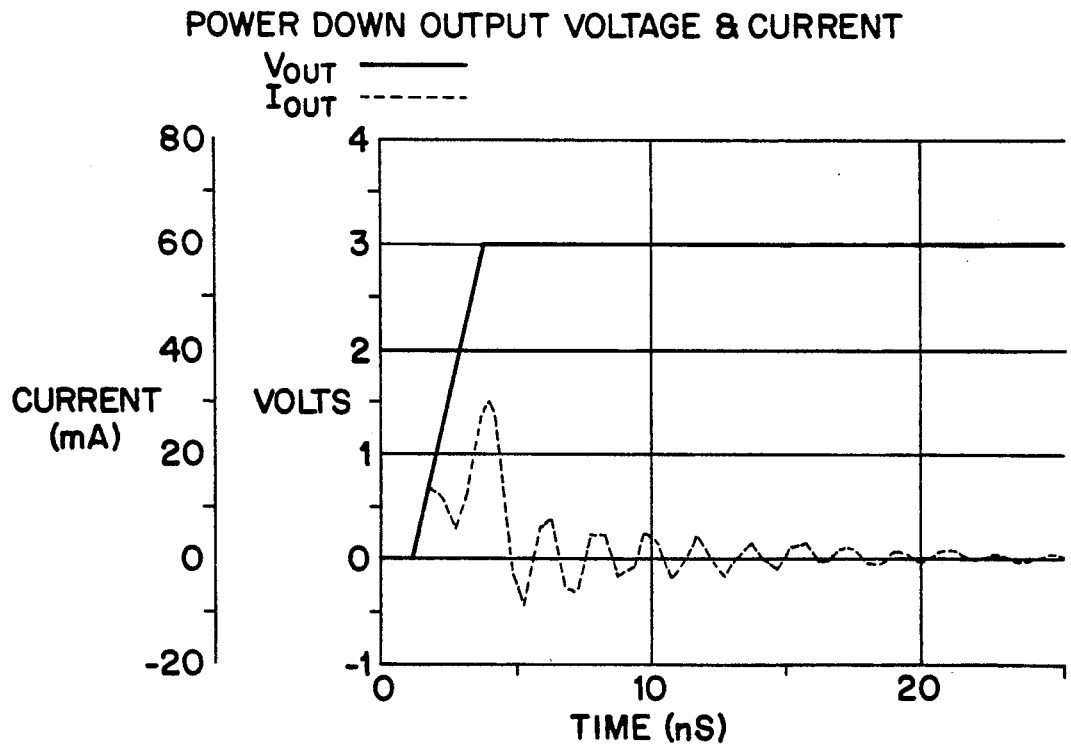
FIG. 3 is a graph showing the same measured quantify as in FIG. 2 but where a preferred embodiment of the present invention has been added to the related-art circuit depicted in FIG. 1.
Figure 4:
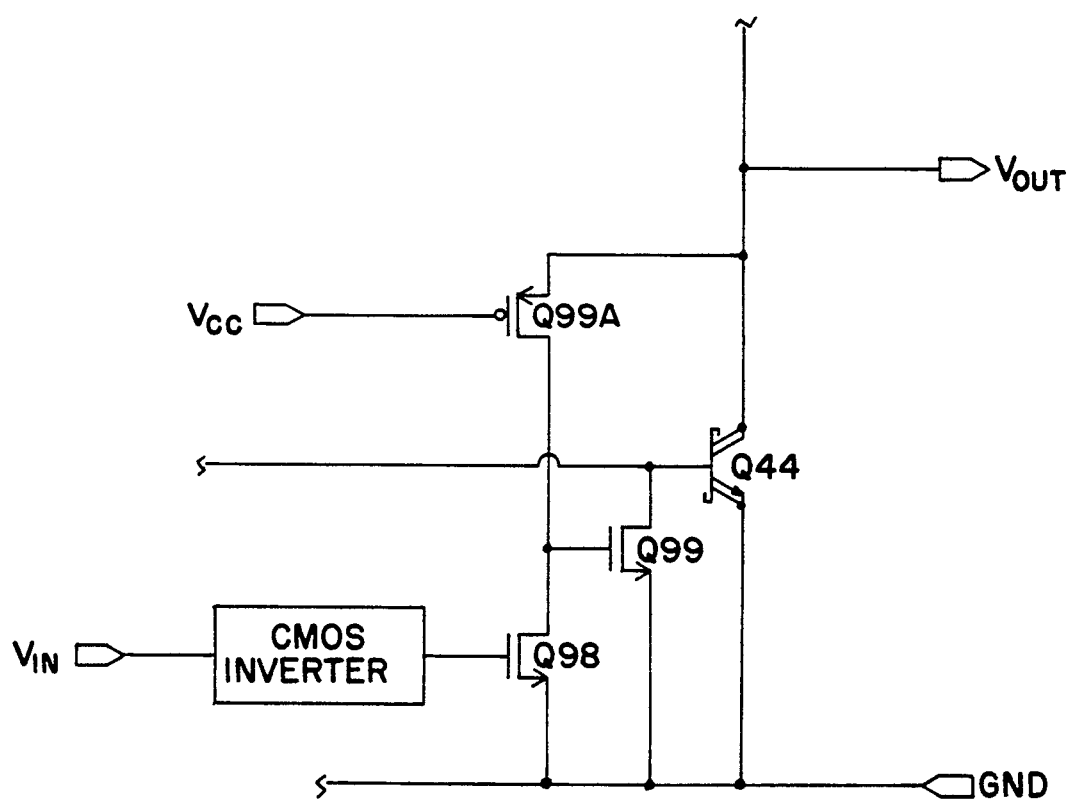
FIG. 4 depicts the preferred embodiment of the circuit of the present invention.
Figure 5:
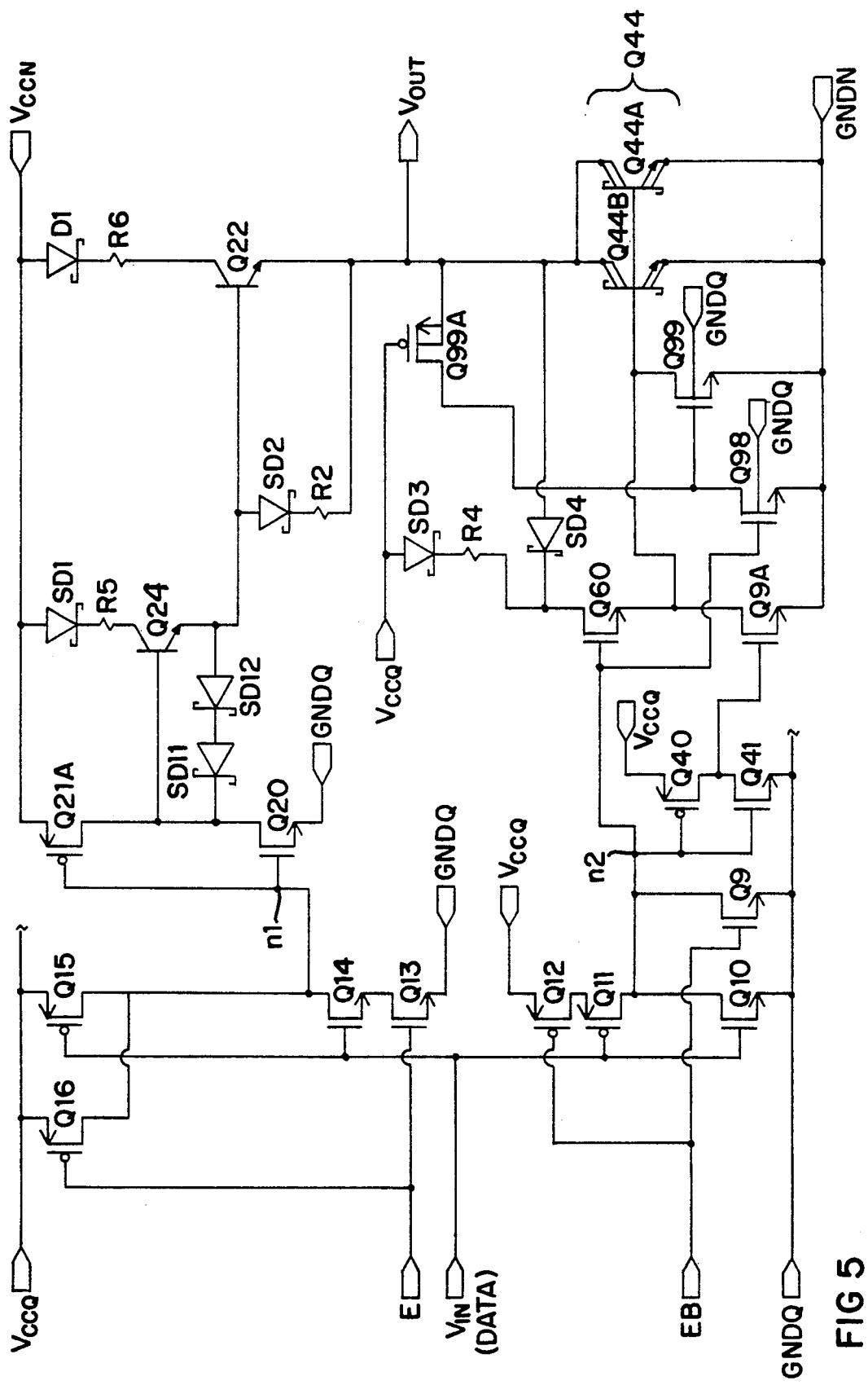
FIG. 5 depicts the preferred embodiment of the circuit of the present invention incorporated into the related-art circuit depicted in FIG. 1.
Figure 5A:
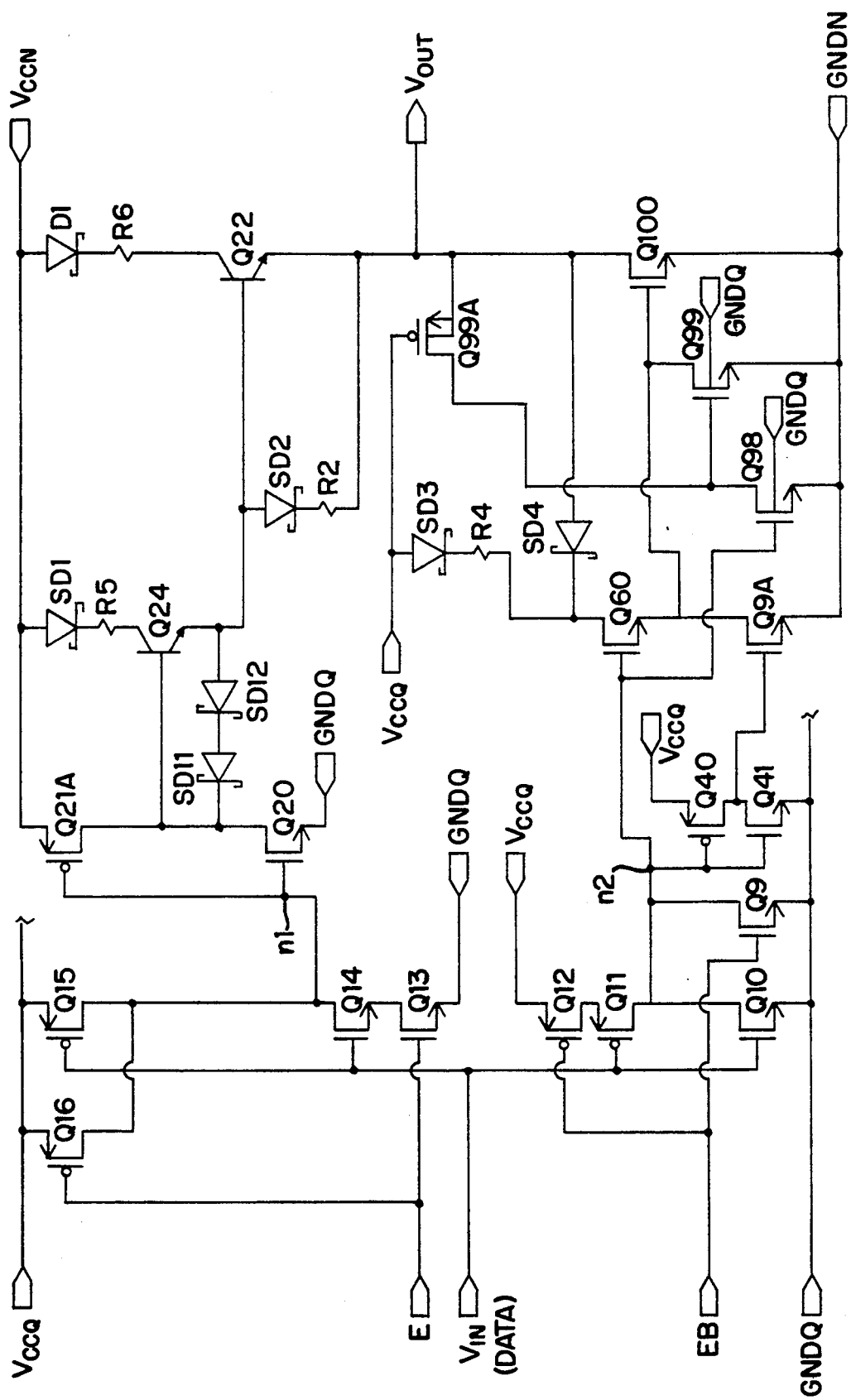

FIG. 4 shows the preferred embodiment of the present invention in semi-isolation, coupled to a pulldown transistor Q44, a buffer low potential power rail GND, a buffer high potential power rail $V_{CC}$, a buffer output $V_{OUT}$, and a buffer input $V_{IN}$ through a CMOS inverter stage. Said preferred embodiment proper comprises a PDMK driver transistor Q99A, a PDMK transistor Q99, and a PDMK disabler transistor Q98. FIG. 5 shows said preferred embodiment incorporated into a BiCMOS tristate output buffer already described as related art. FIG. 5A shows said preferred embodiment alternative incorporated into a BiCMOS tristate output buffer circuit with a MOS output pulldown transistor Q100. With reference to FIG. 4 and FIG. 5, said PDMK transistor Q99 is coupled between said low potential power rail GND and a base node of a high-current-capacity Schottky-clamped pulldown transistor Q44. Said PDMK driver transistor Q99A is coupled between said buffer $V_{OUT}$ and a control gate node of said PDMK transistor Q99. A control gate node of said PDMK driver transistor Q99A is coupled to said high potential power rail $V_{CC}$. While the description of the preferred embodiment is directed to use with a bipolar output pulldown transistor such as said Schottky-clamped pulldown transistor Q44, it is to be understood that said PMOS output pulldown transistor Q100 can be used in conjunction with said PDMK transistor Q99, as illustrated in FIG. 5A. In this alternative embodiment, said PDMK transistor Q99 is coupled between said low potential power rail GNDN and a control gate node of said PMOS output pulldown transistor Q100.

In operation, said output $V_{OUT}$ is connected to a common bus through which said buffer and a multiplicity of similar buffers communicate with the outside world. When said buffer is powered up, said high potential power rail $V_{CC}$ is at a potential equal to or high than any potential to which said output $V_{OUT}$ can be forced by said common bus. With continuing reference to FIG. 4 (or FIG. 5), it can be easily seen that under such conditions, said PDMK driver transistor Q99A can never be biased into a conducting state. That in turn means that said PDMK transistor Q99 cannot be biased into a conducting state by said output $V_{OUT}$ being forced high and hence said PDMK circuit has no effect on the operation of said pulldown transistor Q44 or on any other part of said buffer. In contrast, if said buffer is powered down, said high potential power rail $V_{CC}$ can be at a lower potential than said output $V_{OUT}$ when the latter is forced high by said common bus. In the limit as said high potential power rail $V_{CC}$ approaches a potential of zero with respect to said low potential power rail GND, said control gate of said PDMK driver transistor Q99A will be biased to a logic low level by a transient voltage arising when said output $V_{OUT}$ is forced high by said common bus, and said PDMK driver transistor Q99 will become conducting. Upon such an occurrence, said control gate of said PDMK transistor Q99 will be biased with a logic high signal and will also become conducting. This will serve to provide a low-impedance path to said low potential power rail GND for any capacitive feedback current (Miller Current) coupled between said output $V_{OUT}$ and said base of said pulldown transistor Q44 by said transient arising when said output $V_{OUT}$ is forced high by said common bus while said buffer is powered down. In this manner inadvertent turnon of said pulldown transistor Q44 by Miller Current is averted while said buffer is powered down.

To safeguard against the possibility of said PDMK transistor Q99 being conducting during the period that said buffer is powered up and said control gate of said PDMK transistor Q99 is otherwise isolated, said PDMK disabler transistor Q98 is also coupled to said control gate of said PDMK transistor Q99. With continuing reference to FIG. 4, note that said PDMK disabler transistor Q98 in fact couples said control gate of said PDMK transistor Q99 to said low potential power rail GND. A control gate node of said PDMK disabler transistor Q98 is then connected to an output of a CMOS pulldown-input-inverter-stage.

With reference to FIG. 5, said CMOS pulldown-input-inverter-stage is comprised of NMOS transistor Q10 and PMOS transistor Q11, the common control gates of which are directly coupled to said input $V_{IN}$. With continuing reference to FIG. 5, note that said tristate buffer is controlled by enabling signal input E and complementary enabling signal input EB. For present purposes it is only necessary to note that said complementary enabling signal input EB couples directly to a control gate of an enabling PMOS transistor Q12 which is coupled between said high potential power rail $V_{CCQ}$ and said PMOS transistor Q11. Thus, when a logic low signal is applied to enable signal input EB (as part of placing said buffer in its active mode), said PMOS transistor Q11 of said CMOS pulldown-input-inverter-stage is tied directly to said high potential power rail $V_{CCQ}$. When a logic low signal is applied to said input $V_{IN}$ a logic high signal emerges from said CMOS pulldown-input-inverter-stage and is applied to said control gate of said PDMK disabler transistor Q98, which thus becomes conducting and ties said control gate of said PDMK transistor Q99 to said low potential power rail GNDN. This in turn ensures that said PDMK transistor Q99 remains off and has no effect on said pulldown transistor Q44. In this manner an affirmative disabling of said PDMK circuit takes place when said buffer is in its active low state.

We claim:

1. A Power-Down-Miller-Killer circuit for guarding an output pulldown transistor of an output buffer capable of current-sourcing and current-sinking at a signal output $V_{OUT}$, said Power-Down-Miller-Killer circuit comprising,
   (a) a Power-Down-Miller-Killer-driver-transistor having a control gate coupled to a high potential power rail $V_{CC}$ and with primary current path between said output $V_{OUT}$ and a control node of
   (b) a Power-Down-Miller-Killer-transistor with primary current path between a control node of said output pulldown transistor and a low potential power rail GND,
   (c) a Power-Down-Miller-Killer-disabler means for ensuring that when said buffer is in an active current-sinking state, said Power-Down-Miller-Killer-transistor is not conducting.

2. A Power-Down-Miller-Killer circuit as described in claim 1 wherein
   (a) said output pulldown transistor is a bipolar transistor,
   (b) said Power-Down-Miller-Killer-driver-transistor is a MOS transistor with a control gate coupled to said high potential power rail $V_{CC}$ and a primary current path between said output $V_{OUT}$ and a control gate of said Power-Down-Miller-Killer-transistor, and
   (c) said Power-Down-Miller-Killer-transistor is a MOS transistor coupled between a base node of said output pulldown transistor and said low potential power rail GND.

3. A Power-Down-Miller-Killer circuit as described in claim 2 wherein said output buffer also comprises an input $V_{IN}$ coupled to a CMOS pulldown-driver-input-inverter-stage, and wherein said Power-Down-Miller-Killer-disabler means comprises a MOS transistor having primary current path between said control gate of said Power-Down-Miller-Killer-transistor and said low potential power rail GND and having a control gate node coupled to an output of said pulldown-driver-input-inverter-stage.

4. A Power-Down-Miller-Killer circuit as described in claim 1 wherein
   (a) said output pulldown transistor is a MOS transistor,
   (b) said Power-Down-Miller-Killer-driver transistor is a MOS transistor coupled between said high potential power rail $V_{cc}$ and a control gate of said Power-Down-Miller-Killer transistor, and
   (c) said Power-Down-Miller-Killer transistor is a MOS transistor coupled between a control gate node of said output pulldown transistor and said low potential power rail GND.

5. A Power-Down-Miller-Killer circuit as described in claim 4 wherein said output buffer also comprises an input $V_{in}$ coupled to MOS pulldown-driver-input-inverter stage, and wherein said Power-Down-Miller-disabler means comprises a MOS transistor having primary current path between said control gate of said Power-Down-Miller-Killer transistor and said low potential power rail GND and having a control gate node coupled to an output of said pulldown-driver-input-inverter stage.

6. A Power-Down-Miller-Killer circuit as described in claim 1 wherein
   (a) said output pulldown transistor is a bipolar transistor Q44,
   (b) said Power-Down-Miller-Killer-driver-transistor is a PMOS transistor Q99A with a control gate coupled to said high potential power rail $V_{CC}$ and primary current path between said output $V_{out}$ and a control gate of said Power-Down-Miller-Killer-transistor, and
   (c) said Power-Down-Miller-Killer-transistor is an NMOS transistor Q99 coupled between a base node of said bipolar transistor Q44 and said low potential power rail GND.

7. A Power-Down-Miller-Killer circuit as described in claim 6 wherein said output buffer also comprises an input $V_{IN}$ coupled to a CMOS pulldown-driver-input-inverter-stage, and wherein said Power-Down-Miller-Killer-disabler means comprise an NMOS transistor Q98 having primary current path between said control gate of said Power-Down-Miller-Killer transistor and said low potential power rail GND and having a control gate node coupled to an output of said pulldown-driver-input-inverter-stage.

8. A Power-Down-Miller-Killer circuit as described in claim 1 wherein
   (a) said output pulldown transistor is an NMOS transistor Q100,
   (b) said Power-Down-Miller-Killer-driver transistor is a PMOS transistor Q99A coupled between said high potential power rail $V_{CC}$ and a control gate of said Power-Down-Miller-Killer transistor, and
   (c) said Power-Down-Miller-Killer transistor is a PMOS transistor coupled between a control gate node of said output pulldown transistor and said low potential power rail GND.

9. A Miller Killer improvement for a BiCMOS tri-state output buffer circuit for delivering output signals of high and low potential levels at an output $V_{out}$ in response to data signals at an input $V_{in}$, comprising
   (a) a relatively high-current-capacity bipolar primary-output-pulldown-transistor Q44 having a primary current path through collector and emitter nodes coupled for sinking current from said output $V_{out}$ to a low potential power rail GND, a MOS output-pulldown-driver-transistor Q60 coupled between a high potential power rail $V_{cc}$ and a base node of said bipolar primary-output-pulldown-transistor Q44, and having a control gate node coupled to said input $V_{in}$ through an input circuit, and
   (b) a CMOS pulldown-predriver-input-stage incorporating an NMOS transistor Q10 and a PMOS transistor Q11 with common control gate nodes coupled to said input $V_{in}$, said Miller Killer improvement being a circuit for diverting and discharging base/collector-capacitive-feedback-Miller-Current from said base node of said bipolar primary-output-pulldown-transistor Q44 and comprising:
- (a) a Power-Down-Miller-Killer-driver-transistor Q99A having a control gate coupled to said high potential rail $V_{cc}$ and having a primary current path through drain and source nodes coupled between said output $V_{out}$ and a control gate of a Power-Down-Miller-Killer-transistor Q99, wherein said Power-Down-Miller-Killer-transistor Q99 has a primary current path through drain and source nodes coupled between a base node of said bipolar primary-output-pulldown-transistor Q44 and said low potential power rail GND, and
- (b) a Power-Down-Miller-Killer-disabler means for ensuring that when said tristate output buffer is active and in the logic low output state said Power-Down-Miller-Killer-transistor Q99 is not conducting.

10. The Miller Killer improvement as set out in claim 9 wherein said disabler means comprises a disabler transistor Q98 having primary current path through drain and source nodes coupled between said control gate of said Power-Down-Miller-Killer-transistor Q99 and said low potential power rail GND and having a control gate node coupled to said output of said pulldown-predriver-input-stage Q11,Q10.

11. A Power-Down-Miller-Killer circuit, used in combination with a pulldown output transistor of a tristate output buffer coupled between a high potential power rail $V_{CC}$ and a low potential power rail GND and with a buffer output $V_{OUT}$ coupled to a common bus, for discharging from a base node of said pulldown output transistor a capacitive feedback Miller current generated by an L→H transition at said common bus when said tristate output buffer is powered down, comprising
- a) a MOS Miller Killer transistor having a primary current path through drain and source nodes coupled between said base node of said pulldown output transistor and said low potential power rail GND, and having a control gate coupling means, connected to a drain node of a Power-Down-Miller-Killer-driver, which permits said Miller Killer transistor to conduct only when said high potential power rail $V_{CC}$ has been reduced significantly below its normal operating potential, and
- (b) a disabler transistor having primary current path between said control gate of said Power-Down-Miller-Killer-transistor and said low potential power rail GND and having a control gate node coupled to an output of a pulldown-predriver-input-stage, for ensuring that said Miller Killer transistor is non-conducting when said tristate output buffer is in its active low state, regardless of the potential of said high potential power rail $V_{CC}$.

12. A BiCMOS output buffer circuit for delivering output signals of high and low potential levels at an output $V_{OUT}$ in response to data signals at an input $V_{IN}$, a relatively large-current-capacity bipolar primary-output-pulldown-transistor Q44 having a primary current path through collector and emitter nodes coupled for sinking current from said output $V_{OUT}$ to a low potential power rail GND, a MOS output pulldown driver transistor Q60 having a primary current path through drain and source nodes coupled to a base node of said bipolar primary-output-pulldown-transistor Q44 and a control gate node coupled to said input $V_{IN}$ and having a CMOS Power-Down-Miller-Killer circuit comprising
- (a) a Power-Down-Miller-Killer-driver-transistor Q99A having a control gate coupled to said high potential rail $V_{CC}$ and a primary current path coupled between said output $V_{OUT}$ and a control gate of
- (b) a Power-Down-Miller-Killer-transistor Q99 with a primary current path coupled between a base node of said primary-output-pulldown-transistor Q44 and said low potential power rail GND, and
- (c) a Power-Down-Miller-Killer-disabler means for ensuring that when said BiCMOS tristate output buffer is current sinking, said Power-Down-Miller-Killer-transistor Q99 is non-conducting.

13. A BiCMOS tristate output buffer as set out in claim 12, wherein said output buffer also comprises a CMOS pulldown-driver-input-inverter-stage, an input to which is coupled to said input $V_{IN}$ and wherein said Power-Down-Miller-Killer-disabler means comprises a disabler-transistor having primary current path coupled between said control gate of said Power-Down-Miller-Killer-transistor and said low, potential power rail GND, wherein a control gate node of said disabler-transistor is coupled to an output of said pulldown-driver-input-inverterstage.

14. A BiCMOS tristate output buffer as set out in claim 13, wherein said high potential power rail $V_{CC}$ is divided into (a) a quiet high potential power rail $V_{CCQ}$ for powering input stages of said tristate output buffer, said input stages comprising a pullup-predriver-input-stage, Q14, Q15 and an input-inverterstage Q11, Q12, and (b) a "noisy" high potential power rail $V_{CCN}$ for supplying current for current-sourcing circuitry and wherein said low potential power rail GND is divided into (a) a quiet low potential power rail GNDQ forming a low potential power rail for said input stages of said tristate output buffer and (b) a noisy low potential power rail GNDN for sinking current from said primary-output-pulldown-transistor Q44, and wherein said Power-Down-Miller-Killer-transistor Q99 and said Power-Down-Miller-Killer-disabler-transistor Q98 both sink current to said noisy low potential power rail GNDN while having bulks coupled to said quiet low potential power rail GNDQ, and wherein said control gate of said Power-Down-Miller-Killer-driver-transistor Q99A is coupled to said quiet high potential power rail $V_{CCQ}$.

15. A Miller Killer improvement for a BiCMOS tristate output buffer circuit for delivering output signals of high and low potential levels at an output $V_{out}$ in response to data signals at an input $V_{in}$, comprising
- (a) a MOS output-pulldown-transistor Q100 having a primary current path through source and drain nodes coupled for sinking current from said output $V_{out}$ to a low potential power rail GND, a MOS output-pulldown-driver-transistor Q60 coupled between a high potential power rail $V_{CC}$ and a control gate node of said MOS output-pulldown-transistor Q100, and having a control gate node coupled to said input $V_{in}$ through an input circuit, and
- (b) a CMOS pulldown-predriver-input-stage incorporating NMOS transistor Q10 and a PMOS transistor Q11 with common control gate nodes coupled to said input $V_{in}$, said Miller Killer improvement being a circuit for diverting and discharging parasitic feedback current from said MOS output-pulldown-transistor Q100 and comprising:
- (a) a Power-Down-Miller-Killer-driver-transistor Q99A having a control gate coupled to said high potential rail $V_{cc}$ and having a primary current path through drain and source nodes coupled between said output $V_{out}$ and a control gate of a Power-Down-Miller-Killer-transistor Q99, wherein said Power-Down-Miller-Killer-transistor Q99 has a primary current path through drain and source nodes coupled between said control gate node of said CMOS output-pulldown-transistor Q100 and said low potential power rail GND, and
- b) Power-Down-Miller-Killer-disabler means for ensuring that when said tristate output buffer is active and in the logic low output state said Power-Down-Miller-Killer-transistor Q99 is not conducting.

16. The Miller Killer improvement as set out in claim 15 wherein said Power-Down-Miller-Killer-disabler comprises a disabler transistor Q98 having primary current path through drain and source nodes coupled between said control gate of said Power-Down-Miller-Killer-transistor Q99 and said low potential power rail GND and having a control gate node coupled to said output of said pulldown-predriver-input-stage Q11, Q10.

17. A Power-Down-Miller-Killer circuit for discharging from said pulldown output transistor a capacitive feedback Miller current generated by a L→H transition at said common bus when said tristate output buffer is powered down, used in combination with a pulldown output transistor of a tristate output buffer coupled between a high potential power rail $V_{CC}$ and a low potential power rail GND and with a buffer output $V_{OUT}$ coupled to a common bus, said Power-Down-Miller-Killer circuit comprising
- (a) a MOS Miller Killer transistor having a primary current path through drain and source nodes coupled between a control gate node of said pulldown output transistor and said low potential power rail GND, and having a control gate coupling means which permits said Miller Killer transistor to conduct only when said high potential power rail $V_{CC}$ has been reduced significantly below its normal operating potential, and
- (b) a disabler transistor Q98 having primary current path coupled between said control gate of said Power-Down-Miller-Killer-transistor Q99 and said low potential power rail GND and having a control gate node coupled to an output of said pulldown-predriver-input-stage Q11, Q10, for ensuring that said Miller Killer transistor is non-conducting when said tristate output buffer is in its active low state, regardless of the potential of said high potential power rail $V_{CC}$.

18. A BiCMOS output buffer circuit for delivering output signals of high and low potential levels at an output $V_{OUT}$ in response to data signals at an input $V_{IN}$, a MOS output-pulldown-transistor Q100 having a primary current path through source and drain nodes coupled for sinking current from said output $V_{OUT}$ to a low potential power rail GND, a MOS output pulldown driver transistor Q60 having a primary current path through drain and source nodes coupled to a control gate node of said MOS output-pulldown-transistor Q100 and a control gate node of said MOS output pulldown driver transistor Q60 coupled to said input $V_{IN}$, and having a MOS Power-Down-Miller-Killer circuit comprising
- (a) a Power-Down-Miller-Killer-driver-transistor Q99A having a control gate coupled to said high potential rail $V_{CC}$ and a primary current path coupled between said output $V_{OUT}$ and a control gate of
- (b) a Power-Down-Miller-Killer-transistor Q99 with a primary current path coupled between a control gate node of said MOS output-pulldown-transistor Q100 and said low potential power rail GND, and
- (c) a Power-Down-Miller-Killer-disabler means for ensuring that when said BiCMOS tristate output buffer is current sinking, said Power-Down-Miller-Killer-transistor Q99 is non-conducting.

19. A BiCMOS tristate output buffer as set out in claim 18, wherein said output buffer also comprises a CMOS pulldown-driver-input-invertor-stage, an input to which is coupled to said input $V_{IN}$ and wherein said Power-Down-Miller-Killer-disabler means comprises a disabler-transistor having primary current path coupled between said control gate of said Power-Down-Miller-Killer-transistor and said low potential power rail GND, wherein a control gate node of said disabler-transistor is coupled to an output of said pulldown-driver-input-invertor-stage.

20. A BiCMOS tristate output buffer as set out in claim 19, wherein said high potential power rail $V_{CC}$ is divided into (a) a quiet potential power rail $V_{CCQ}$ for powering input stages of said tristate output buffer, said input stages comprising a pullup-predriver-input stage, Q14, Q15 and an input-inverter-stage Q11, Q12, and (b) a "noisy" high potential power rail $V_{CCN}$ for supplying current for current sourcing circuitry and wherein said low potential power rail GNDQ forming a low potential power rail for said input stages said tristate output buffer and (b) a noisy low potential power rail GNDN for sinking current from said output-pulldown-transistor Q100, and wherein said Power-Down-Miller-Killer-transistor Q99 and said disabler-transistor Q98 both sink current to said noisy low potential GNDN while having bulks coupled to said quiet low potential power rail GNDQ, and wherein said control gate of said Power-Down-Miller-Killer-driver-transistor Q99 is coupled to said quiet high potential power rail $V_{CCQ}$.

* * * * *